United States Patent
Okumura et al.

(10) Patent No.: US 7,641,806 B2
(45) Date of Patent: Jan. 5, 2010

(54) MANUFACTURING METHOD FOR MEMBRANE MEMBER

(75) Inventors: Katsuya Okumura, Tokyo-To (JP); Kazuya Nagaseki, Nirasaki (JP); Naoyuki Satoh, Nirasaki (JP); Koji Maruyama, Nirasaki (JP)

(73) Assignees: Tokyo Electron Limited, Tokyo (JP); OCTEC Inc., Tokyo (JP)

( * ) Notice: Subject to any disclaimer, the term of this patent is extended or adjusted under 35 U.S.C. 154(b) by 0 days.

(21) Appl. No.: 10/864,374

(22) Filed: Jun. 10, 2004

(65) Prior Publication Data

US 2004/0251229 A1 Dec. 16, 2004

(30) Foreign Application Priority Data

Jun. 13, 2003 (JP) .............................. 2003-168612

(51) Int. Cl.
*H01L 21/302* (2006.01)
*H01J 33/00* (2006.01)

(52) U.S. Cl. .............................. 216/2; 216/12; 216/41; 216/49; 216/58; 216/67; 216/72; 216/77; 216/79; 216/80

(58) Field of Classification Search ........................ None
See application file for complete search history.

(56) References Cited

U.S. PATENT DOCUMENTS

| | | | | |
|---|---|---|---|---|
| 3,815,094 A | * | 6/1974 | Smith .......................... | 347/121 |
| 5,520,297 A | * | 5/1996 | Kagami et al. ................ | 216/12 |
| 5,912,095 A | | 6/1999 | Katakura | |
| 6,002,202 A | * | 12/1999 | Meyer et al. ................ | 313/420 |
| 6,787,785 B2 | * | 9/2004 | Moriya et al. ........... | 250/492.23 |
| 6,870,174 B2 | * | 3/2005 | Yamaguchi et al. ...... | 250/492.3 |
| 7,006,426 B2 | * | 2/2006 | Chiu et al. ............. | 369/112.23 |
| 2001/0046776 A1 | * | 11/2001 | Kim ........................... | 438/700 |
| 2003/0031939 A1 | * | 2/2003 | Butschke et al. ............... | 430/5 |
| 2005/0014076 A1 | * | 1/2005 | Omori ........................... | 430/5 |

FOREIGN PATENT DOCUMENTS

| | | | |
|---|---|---|---|
| DE | 19603829 A1 | * | 8/1997 |
| JP | 58-82522 | | 5/1983 |
| JP | 5-165198 | | 6/1993 |
| JP | 7-135129 | | 5/1995 |
| JP | 10-106943 | | 4/1998 |
| JP | 2003-100583 | | 4/2003 |
| WO | WO 2101803 A1 | * | 12/2002 |

* cited by examiner

*Primary Examiner*—Anita K Alanko
(74) *Attorney, Agent, or Firm*—Smith, Gambrell & Russell, LLP (57) ABSTRACT

By steps of forming first masks 13, 14 each having a first pattern on a first surface of a substrate 11 on which a membrane is to be formed, etching the first surface of the substrate 11 by using the first masks 13, 14 to forming first support beams 15, positioning a second surface of the substrate 11 on the basis of the first pattern on the first surface, forming a second mask 17 having a second pattern on the second surface of the substrate 11 based on the alignment and etching the second surface of the substrate 11 in dry by using the second mask 17 to form the second support beams 20, a membrane member 22*a* where the first and second support beams 15, 20 are formed on both surfaces of the membrane 12 is manufactured. Consequently, it is possible to provide the membrane member that is sufficient in strength and is hard to be deformed by heat.

29 Claims, 9 Drawing Sheets

F I G. 12

MANUFACTURING METHOD FOR MEMBRANE MEMBER

BACKGROUND OF THE INVENTION

1. Field of the Invention

This invention relates to a manufacturing method for a membrane member which may be used for an electron beam transmission window of an electron beam irradiation tube, a stencil mask for electron beam exposure, a mask for X-ray exposure and so on.

2. Background Art

For the stencil mask for electron beam exposure, the mask for X-ray exposure, etc., a membrane member having a film thickness of about several micrometers (μm) is used. Japanese Unexamined is Patent Publication (kokai) No. 5-165198 discloses a technique to form such a membrane member on a silicon substrate by means of a semiconductor processing technique, such as exposure and etching.

The membrane member of this kind is also applicable to a variety of applications besides the above-mentioned mask, for example, an electron beam transmission window of an electron beam irradiation tube. As application demands, it may be required to thin a thickness of the membrane member to the submicron degree.

When a membrane member gets thinner in this way, the strength of the membrane member itself is also weakened, so that it may be broken with ease. Therefore, for a membrane member used for the electron beam transmission window of the electron beam irradiation tube, there is an attempt to provide a support beam on one side of the membrane member in order to assure a sufficient strength required for the membrane member. However, it seems that this attempt is still insufficient. Additionally, if this kind of membrane member gets thin and is further applied to an application under the influence of heat, the membrane member may be deformed due to heat.

SUMMARY OF THE INVENTION

In the above-mentioned situation, it is an object of the present invention to provide a method for manufacturing a membrane member that has enough strength and is hard to be deformed due to heat.

In order to solve the above-mentioned problem, the first aspect of the present invention resides in the provision of a manufacturing method for a membrane member, comprising the steps of: forming first support beams patterned with a first pattern on a first surface of a substrate; positioning a second surface of the substrate on the basis of a reference place on the substrate; and forming second support beams patterned with a second pattern on a second surface of the substrate, whereby the membrane member where the first and second support beams are formed on both surfaces of a membrane is manufactured.

The second aspect of the invention resides in the provision of a manufacturing method for a membrane member, comprising the steps of: etching a first surface of a substrate in dry thereby forming first support beams patterned with a first pattern on the first surface of the substrate; and etching a second surface of the substrate in dry thereby forming second support beams patterned with a second pattern on the second surface of the substrate, whereby the membrane member where the first and second support beams are formed on both surfaces of a membrane is manufactured.

The third aspect of the invention resides in the provision of a manufacturing method the steps of: forming a first mask having a first pattern on a first surface of a substrate on which a membrane is to be formed; etching the first surface of the substrate by using the first mask thereby forming first support beams; forming a second mask having a second pattern on a second surface of the substrate; and etching the second surface of the substrate by using the second mask thereby forming second support beams, whereby the membrane member where the first and second support beams are formed on both surfaces of the membrane is manufactured.

The fourth aspect of the invention resides in the provision of a manufacturing method the steps of: forming a first mask having a first pattern on a first surface of a substrate on which a membrane is to be formed; etching the first surface of the substrate in dry by using the first mask thereby forming first support beams; positioning the second surface of the substrate on the basis of a reference place on the substrate: forming a second mask having a second pattern on a second surface of the substrate on the basis of the positioning step; and etching the second surface of the substrate in dry by using the second mask thereby forming second support beams, whereby the membrane member where the first and second support beams are formed on both surfaces of the membrane is manufactured.

According to the first and the fourth aspects of the invention, it is possible to form the membrane member having the support beams with desired patterns on both surfaces of the membrane and also possible to provide the membrane member with high strength due to the cooperation of the support beams on both surfaces of the membrane. Furthermore, the presence of the support beams allows heat to be radiated from both surfaces of the membrane, whereby the deformation due to heat can be prevented. Moreover, as the positioning is tarried out before forming the second support beams, it is possible to make an effective area of opening parts of the membrane large.

According to the second and the fourth aspects of the invention, since the membrane member having the support beams with desired patterns on both surfaces of the membrane is formed by dry etching, the verticality of the support beams is enhanced, so that it is possible to provide the membrane member with high strength and high radiation due to both of the support beams while keeping an effective area of the opening parts of the membrane broad.

In any of the above aspects, owing to the formation of the support beams on both sides of the membrane, it is possible to reduce the area of the beams and also increase the effective area of the membrane that much.

In the first and the fourth aspects of the invention, the reference place may be formed by the first pattern on the first surface, the outer circumference of the substrate as the basis for forming the first pattern on the first surface, a notch on the substrate as the basis for forming the first pattern on the first surface or an orientation flat of the substrate as the basis for forming the first pattern on the first surface. Additionally, the above positioning can be accomplished by firstly detecting the reference place, secondly giving feedback of positional information of the reference place and thirdly forming a positioning mark on the second surface of the substrate on the basis of the positional information.

In the first to the fourth aspects of the invention, providing that the substrate is a silicon substrate having a $SiO_2$ membrane formed therein in parallel with a main surface of the substrate, to etch silicon on both sides of the $SiO_2$ membrane allows the membrane member to be manufactured to have the support beams on both surfaces of the $SiO_2$ membrane. Alternatively, providing that the substrate is a silicon substrate having a $SiO_2$ membrane formed on a main surface thereof and a polycrystalline silicon film formed on the SiO₂ membrane further, to etch silicon on both sides of the SiO₂ membrane allows the membrane member to be manufactured to have the support beams on both surfaces of the SiO₂ membrane. Further, providing that the substrate is a silicon substrate having an Al membrane formed therein in parallel with a main surface of the substrate, to etch silicon on both sides of the Al membrane allows the membrane member to be manufactured to have the support beams on both surfaces of the Al membrane. Still further, providing that the substrate is a silicon substrate having an Al membrane formed on a main surface thereof and a polycrystalline silicon film formed on the Al membrane further, to etch silicon on both sides of the Al membrane allows the membrane member to be manufactured to have the support beams on both surfaces of the Al membrane. Or again, providing that the substrate is a silicon substrate having double-layer SiO₂ membranes formed therein in parallel with a main surface of the substrate, to first etch silicon outside the double-layer SiO₂ membranes and second etch the double-layer SiO₂ membranes allows the membrane member to be manufactured to have the support beams on both surfaces of a silicon membrane formed between the double-layer SiO₂ membranes. Further, providing that the substrate is a silicon substrate having a sapphire membrane formed therein in parallel with a main surface of the substrate, to etch silicon on both sides of the sapphire membrane allows the membrane member to be manufactured to have the support beams on both surfaces of the sapphire membrane. Still further, providing that the substrate is a silicon substrate having a sapphire membrane formed on a main surface thereof and a polycrystalline silicon film formed on the sapphire membrane further, to etch silicon on both sides of the sapphire membrane allows the membrane member to be manufactured to have the support beams on both surfaces of the sapphire membrane. Preferably, the sapphire membrane is formed so that a cleavage surface thereof is substantially parallel with the main surface.

In the first to the fourth aspects of the invention, preferably, a coating layer is formed on the whole area of the membrane, the first support beams and the second support beams. The coating layer may be formed by heat treatment. After forming the first support beams or the second support beams of the substrate, by etching the whole area of a substrate's surface provided with the support beams in dry, it is possible to adjust respective heights of the first support beams or the second support beams. Furthermore, it is preferable to form the first support beams and the second support beams in a lattice manner. Preferably, ones of the first support beams and the second support beams are larger in height than and also broader in grid interval than the others of the first support beams and the second support beams.

These and other objects and features of the present invention will become more fully apparent from the following description and appended claims taken in conjunction with the accompany drawings.

BRIEF DESCRIPTION OF THE DRAWINGS

FIGS. 3A to 3I are sectional views explaining the flow of the first manufacturing method of the present invention, in due order;

DESCRIPTION OF THE PREFERRED EMBODIMENT

Embodiments of the present invention will be described with reference to the attached drawings.

Figure 1:
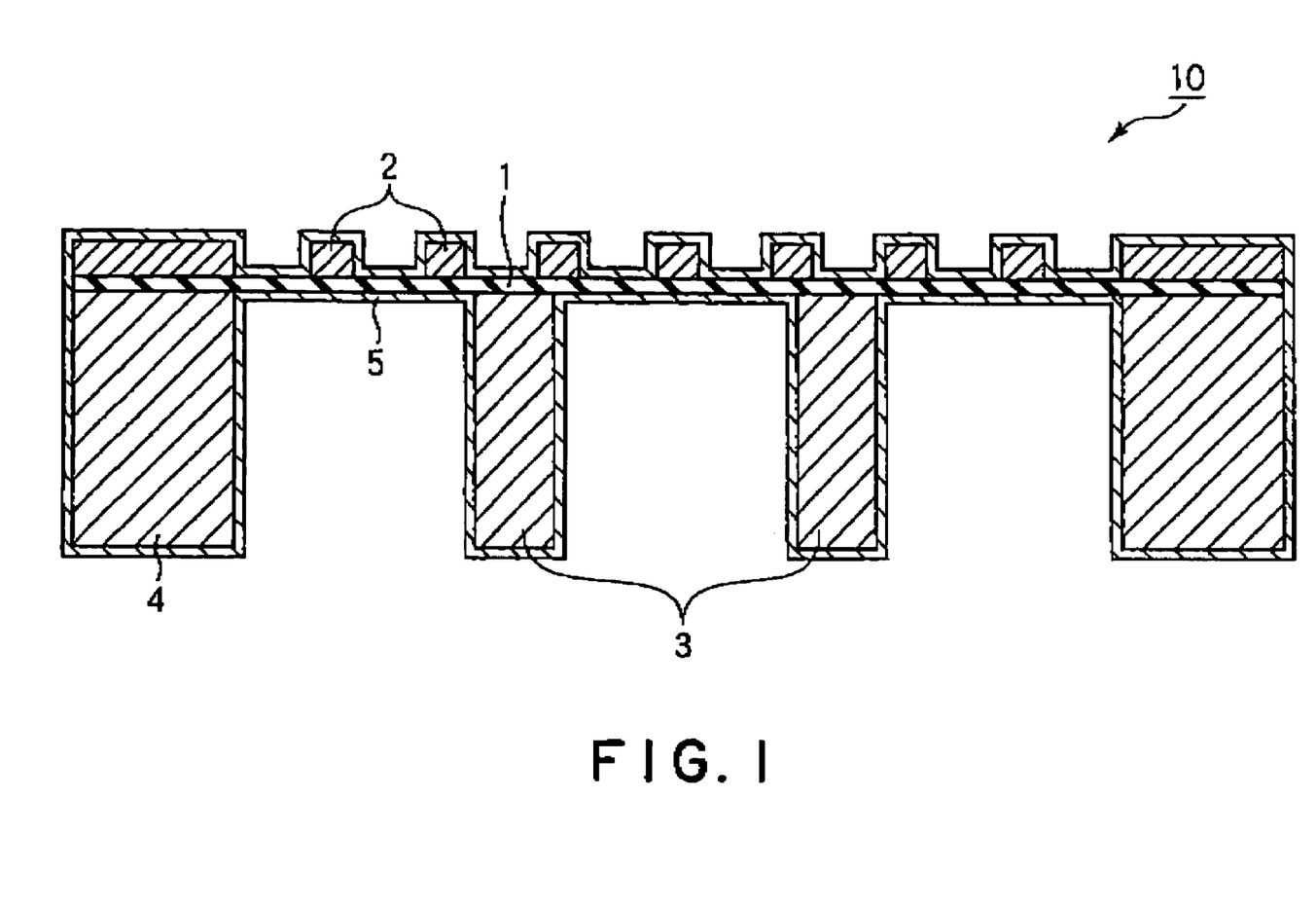
FIG. 1 is a sectional view showing one example of a membrane member in accordance with the manufacturing method of the present invention.

FIG. 1 is a sectional view showing one example showing a membrane member obtained by the manufacturing method of the invention. As shown in FIG. 1, the membrane member 10 includes a membrane 1 made of e.g. SiO₂, first support beams 2 made of e.g. Si and formed on one (first) surface of the membrane 1, second support beams 3 also made of e.g. Si and formed on the other (second) surface of the membrane 1 and a support wall 4 arranged on the periphery of the membrane 1. These elements about the membrane member 10 are covered, on the whole surface, with a SiN film 5. As for the other material for the membrane 1, there may be employed Al, Si or the like in place of SiO₂.

In case of a stencil mask for electron beam exposure, a mask for X-ray exposure or the like, the membrane 1 has a thickness of approximately 1 μm to 2 μm. While, in case of the application of an electron beam transmission window of the electron beam irradiation tube etc., the thickness of the membrane 1 is required to be less than 0.6 μm including the film thickness of the SiN film 5. Note, the SiN film 5 is provided to enhance the whole strength of the membrane member 10 furthermore and has a thickness less than 0.1 μm.

Figure 2A:
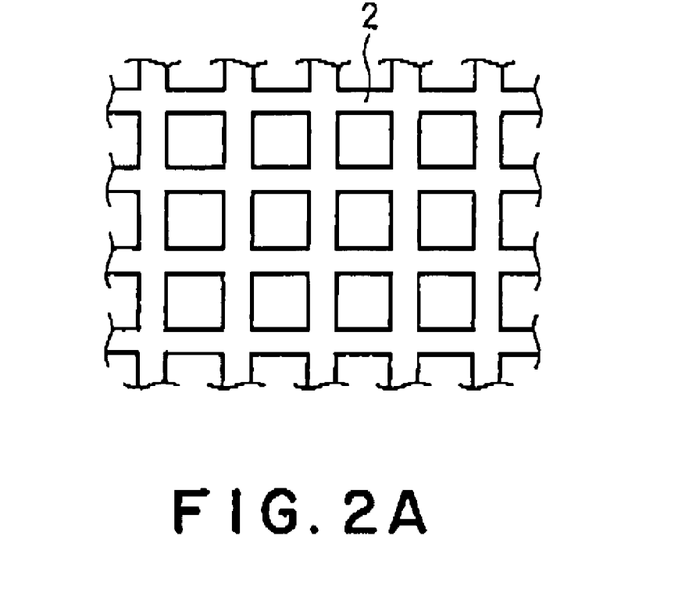
FIG. 2A is a plan view showing a pattern of a first supporting beam of the membrane member in accordance with the manufacturing method of the present invention and FIG. 2B is a plan view showing a pattern of a second supporting beam of the membrane member by the manufacturing method of the invention.
Figure 2B:
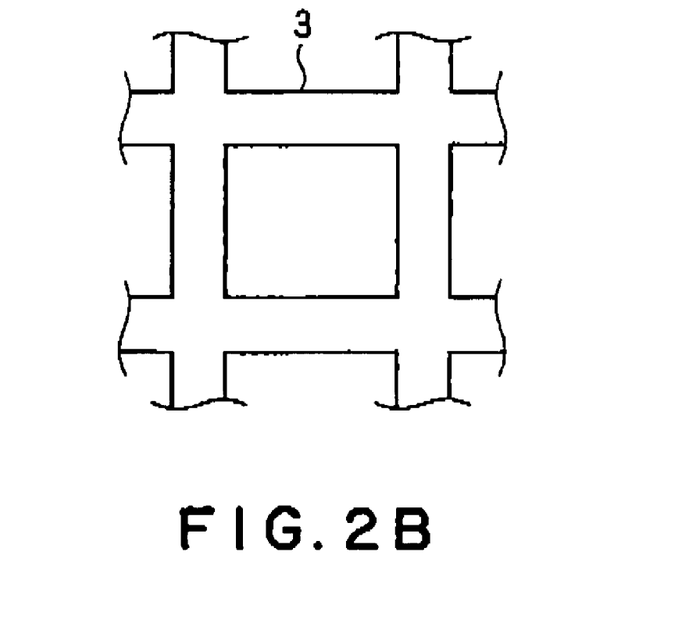

The first support beams 2 are formed to have approx. 2 μm to 5 μm in each height, approx. 1 μm in each width and approx. 5 μm of intervals, providing a lattice pattern as shown in FIG. 2A. On the other hand, the second support beams 3 are formed to have approx. 100 μm to 200 μm in each width, approx. 500 μm to 1000 μm of intervals and approx. 150 μm to 725 μm in each height though it depends on the film thickness of a Si-wafer used in manufacturing the membrane member 10, providing a lattice pattern as shown in FIG. 2B. That is, the first support beams 2 and the second support beams 3 have respective lattice patterns of different sizes. Note, these dimensional features (intervals etc.) characterizing the first support beams 2 and the second support beams 3 are not limited to only the above values. For example, the first support beams 2 and the second support beams 3 are respectively formed at the same intervals, providing the same lattice patterns in size.

Owing to the provision of the support beams on both sides of the membrane 1, the whole strength of the membrane member 10 is enhanced. Additionally, since heat of the membrane 1 is irradiated through the intermediary of the support beams 2, 3, the membrane member 10 is prevented from being deformed due to heat.

Note, FIG. 1 merely shows the arrangements of the support beams 2, 3 typically. In practical, the numbers of the beams 2, 3 are more than the shown numbers and are also determined as a required area demands.

Next, the manufacturing method of the membrane member as above will be described below.

Figure 3A:
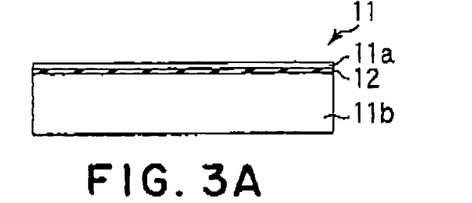

First, we now describe the first manufacturing method. FIGS. 3A to 3I are sectional views showing the flow of the first manufacturing method. First, prepare a Si wafer (SOI wafer) 11 containing a $SiO_2$ film 12 in parallel with a main face of the wafer 11 (FIG. 3A). The $SiO_2$ film 12 is arranged in a position apart from the surface of the Si wafer 11 by approx. 2 μm, for example. That is, a Si-part of the Si wafer 11 is divided into a thin portion 11a and a thick portion 11b through the $SiO_2$ film 12.

Figure 3B:
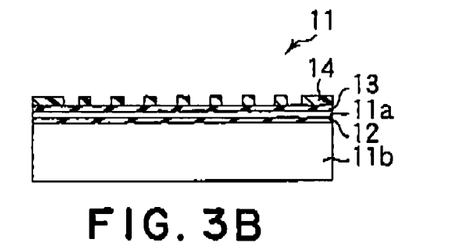
Figure 3C:
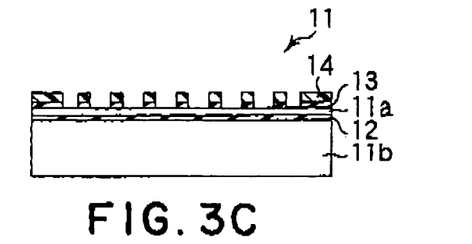
Figure 4:
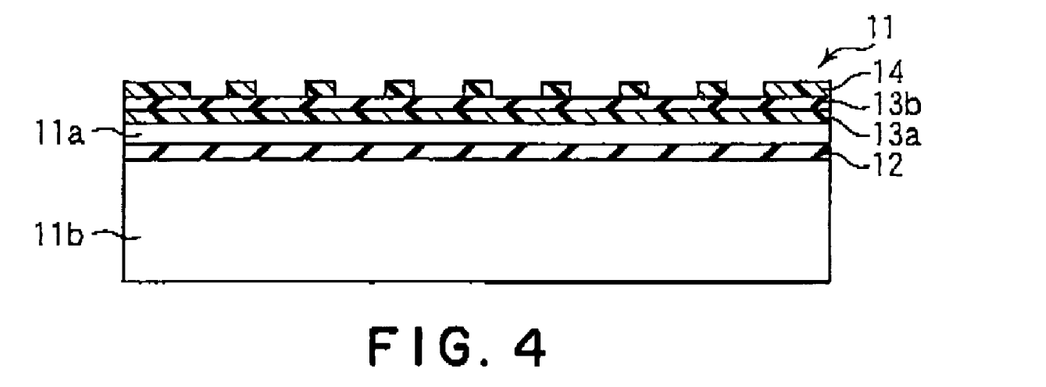
FIG. 4 is a sectional view showing another example of a process of FIG. 3B.

Next, by means of e.g. TEOS, a $SiO_2$ film 13 is formed on the main face of the Si wafer 11 thereby forming a resist pattern 14 by photolithography (FIG. 3B). In succession, the $SiO_2$ film 13 is subjected to RIE-etching while utilizing the resist pattern 14 as a mask (FIG. 3C). By these processes of FIGS. 3B and 3C, a mask to etch the thin portion 11a of the Si wafer 11 is produced. Alternatively, providing of using a resist of FIG. 4 where a resist pattern 14 is established on a resist film 13a and a glass (SOG) film 13b by photolithography and further utilizing the resist pattern 14 as a mask, it may be carried out to develop the resist film 13a and the glass film 13b in dry, thereby providing an etching mask.

Figure 3D:
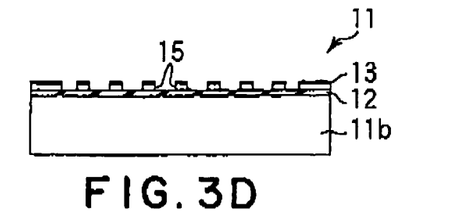

Then, the thin portion 11a of the Si wafer 11 is subjected to RIE etching while using the resist pattern 14 and the patterned $SiO_2$ film 13 as an etching mask, thereby forming first support beams 15 with a designated pattern and additionally, the resist pattern 14 is removed by ashing (FIG. 3D). In this regard, if the verticality of etching is large in its degree of freedom, the portion 11a may be etched while using only the resist pattern 14 as an etching mask. However, considering the verticality of etching severely, it is preferable to adopt the resist pattern 14 and the $SiO_2$ film 13 as the etching mask 2.

Figure 3E:
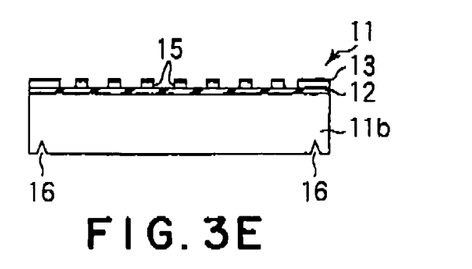

Next, in order to form the second support beams on the thick portion 11b of the Si wafer 11, alignment marks (positioning marks) 16 are formed on the surface of the thick portion 11b of the Si wafer 11 on the basis of the pattern of the first support beams 15 by means of laser processing (FIG. 3E). Note, a laser processor for this process will be described later.

Figure 3F:
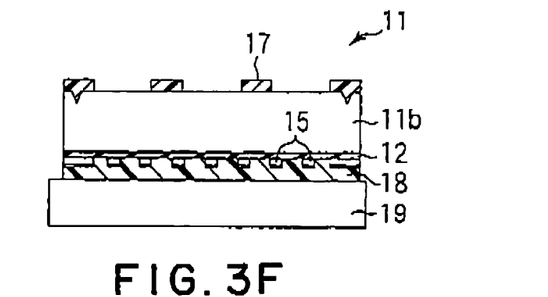

After that, the Si wafer 11 is reversed and further, its surface on the side of the first support beams 15 is applied on a base wafer 19 through an adhesive 18 in order to protect the first support beams 15. Additionally, on the basis of the alignment marks 16, a thick film resist pattern 17 is formed on the surface of the thick portion 11b of the Si wafer 11 by photolithography (FIG. 3F). The adhesive 18 may be replaced by a protective tape (not shown).

Figure 3G:
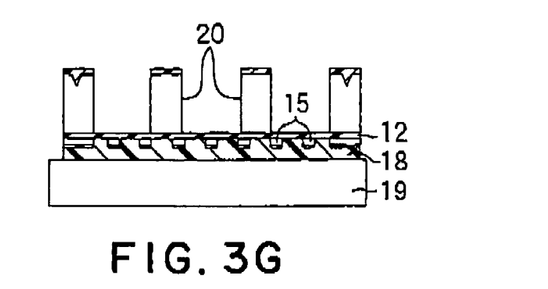
Figure 5A:
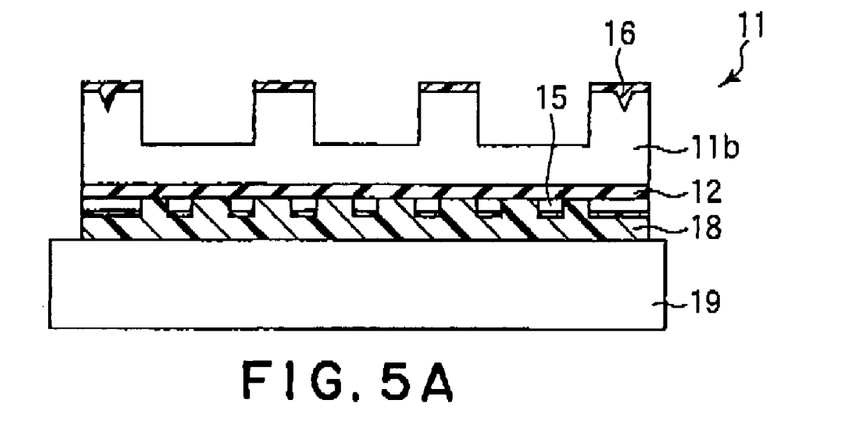
FIGS. 5A and 5B are sectional views showing another example of FIG. 3G.
Figure 5B:
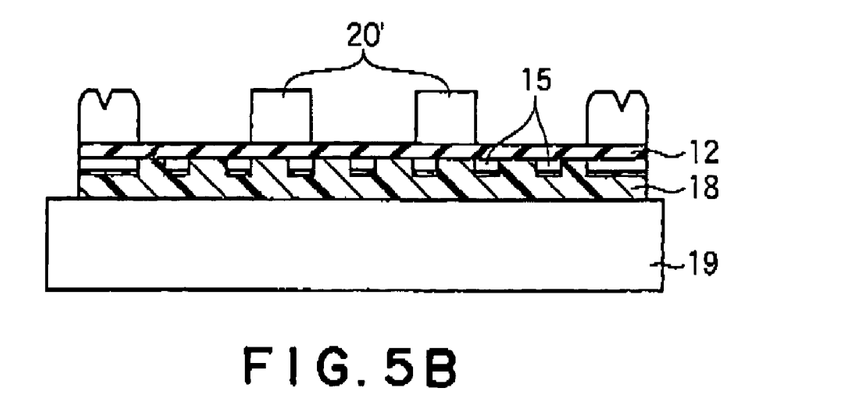

In secession, while using the thick film resist pattern 17 as an etching mask, the thick portion 11b of the Si wafer 11 is subjected to RIE etching to form second support beam 20 and additionally, the thick film resist pattern 17 is removed by ashing (FIG. 3G). Then, if establishing an etching depth equal to the thickness of the portion 11b as shown in FIG. 3G, then each of the second support beams 20 has a height equal to the thickness of the portion 11b. Instead, if giving up in the midstream of the RIE etching of the portion 11b with the thick film resist pattern 17 as an etching mask as shown in FIG. 5A and subsequently etching the portion 11b as a whole as shown in FIG. 5B, then it is possible to finish second support beams 20' each having a desired height.

Figure 3H:
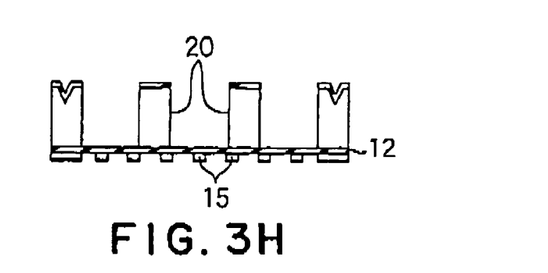

Thereafter, by ashing or cleaning, residual dross of the resist pattern 17 is removed and the adhesive 18 is eliminated after detaching the base wafer 19 (FIG. 3H). Note, if the thickness of the $SiO_2$ film 12 is out of the desired thickness, the $SiO_2$ film 12 is etched in dry or wet after the process of FIG. 3G, thereby realizing the desired thickness.

After that, by CVD (LP-CVD) under low pressure, a coating layer 21 of SiN for reinforcement is formed on the whole surface of the Si wafer 11, thereby completing a membrane member 22a which has the first support beams 15 and the second support beams 20 on both sides of the $SiO_2$ film 12 and whose whole surface is covered with the coating layer 21 of SiN (FIG. 3I). Instead of CVD, the coating layer 21 may be formed by infusing nitrogen ions and subsequently annealing. In this case, since such a processing cannot be applied on both sides of the Si wafer 11 at a time but every side thereof, it is impossible to form the coating layer 21 on the whole surface of the Si wafer 11 in one job.

Next, the above alignment will be described in detail.

Figure 6:
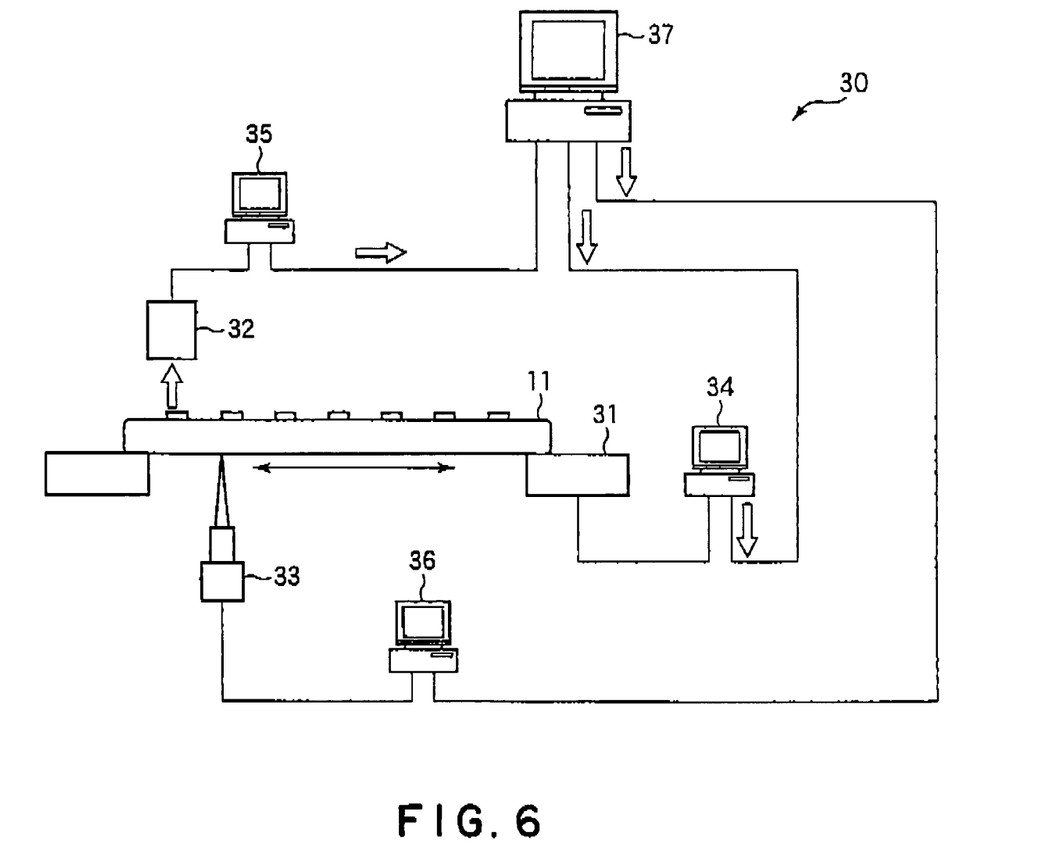
FIG. 6 is a pattern diagram showing a processing apparatus for forming alignment marks.

FIG. 6 shows the processing apparatus for alignment. This processing apparatus 30 includes a drive stage 31 for supporting and driving the Si wafer 11 as an object to be processed, a detector 32, such as CCD camera, for detecting a pattern (of the first support beams 15) on the surface of the Si wafer 11 and a laser processor 33 for processing the back surface of the Si wafer 11. A stage controller (PC) 34 is connected to the drive stage 31. A detector controller (PC) 35 is connected to the detector 32. A laser processor controller (PC) 36 is connected to the laser processor 33. These controllers 34, 35, 36 are connected to a main PC (personal computer) 37 in common.

In the processing apparatus 30 constructed above, the detector 32 firstly detects the pattern of the first support beams 15 on the surface of the Si wafer 11 and outputs a detected information to the detector controller 35. After checking the information of pattern image, the detector controller 35 transmits it to the main PC 37. At the main PC 37, calculation is carried out on the basis of the pattern information from the detector controller 35 and data base stored in the main PC 37, it transmits a processed position to the stage controller 34 and a command of laser processing to the laser processor 33. Consequently, it is possible to form the alignment marks for forming the second support beams 20 on the back surface of the Si wafer 11, on the basis of the pattern of the first support beams 15. Note, instead of such an automatic processing, an operator may designate the processed position on confirmation of the information from the detector controller 35, manually.

In this way, since the pattern information of the first support beams 15 is fed back to form the alignment marks for the second support beams 20, it is possible to position the pattern of the support beams 20 on the basis of the pattern information of the first support beams 15, thereby establishing the positional relationship between the pattern of the first support beams 15 and the pattern of the second support beams 20 with high accuracy. Conversely, if the positioning accuracy between the first support beams 15 and the second support beams 20 is small, it becomes impossible to assure a planned effective area of opening parts of the membrane. However, the increased positioning accuracy between the first support beams 15 and the second support beams 20 allows the effective area of the opening parts of the membrane member to be broadened.

Next, the manufacturing method of the membrane member as above will be described below.

Figure 7A:
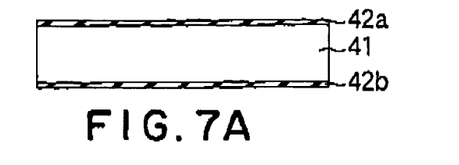
FIGS. 7A to 7J are sectional views explaining the flow of the second manufacturing method of the present invention, in due order.
Figure 7B:
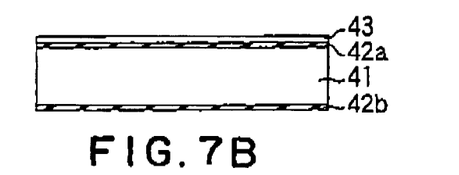

First, we now describe the second method for manufacturing the membrane member. FIGS. 7A to 7J are sectional views showing the flow of the second manufacturing method. First, prepare a Si wafer (bare wafer) 41 and form SiO$_2$ films 42a, 42b on both sides of the wafer 41 by thermal oxidation (FIG. 7A). Alternatively, a SiO$_2$ film may be formed on the only side of the wafer by TEOS. Next, a poly-Si film 43 is formed on the SiO$_2$ film 42a (FIG. 7B).

Figure 7C:
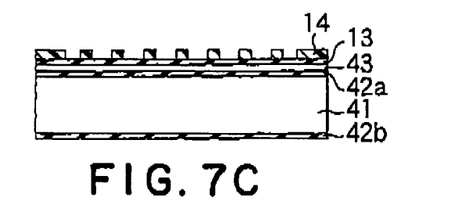
Figure 7D:
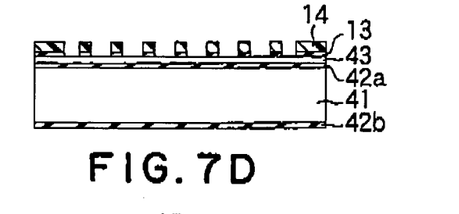

Next, as similar to FIG. 3B, the SiO$_2$ film 13 is formed on the poly-Si film 43 by e.g. TEOS and further, the resist pattern 14 is formed by photolithography (FIG. 7C). In succession, the SiO$_2$ film 13 is subjected to RIE-etching while utilizing the resist pattern 14 as a mask (FIG. 7D). By these processes of FIGS. 7C and 70, a mask to etch the poly-Si film 43 is produced.

Figure 7E:
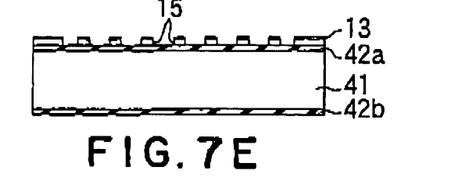

In succession, while using the resist pattern 14 and the patterned SiO$_2$ film 13 as an etching mask, the poly-Si film 43 is subjected to RIE etching, thereby forming first support beams 15 with a designated pattern and additionally, the resist pattern 14 is removed by ashing (FIG. 7E).

Figure 7F:
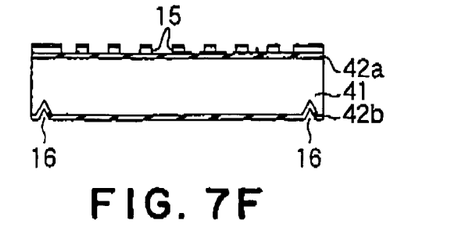

Next, in order to form the second support beams on the Si wafer 41, the alignment marks 16 are formed on the Si wafer's surface on the side of the SiO$_2$ film 42b on the basis of the pattern of the first support beams 15 by means of laser processing (FIG. 7F).

Figure 7G:
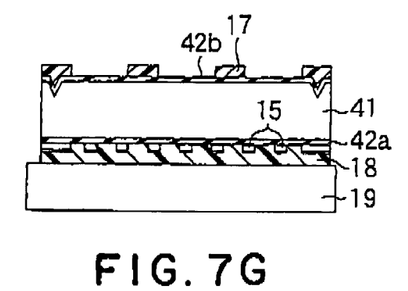

After that, the Si wafer 41 is reversed and further, its surface on the side of the first support beams 15 is applied on the base wafer 19 through the adhesive 18 etc. in order to protect the first support beams 15, as similar to FIG. 3F. Additionally, on the basis of the alignment marks 16, the thick film resist pattern 17 is formed on the surface of the SiO$_2$ film 42b formed on the Si wafer 41 by photolithography (FIG. 7G).

Figure 7H:
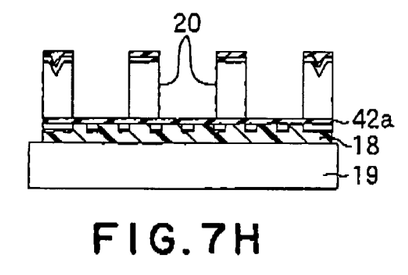

In secession, while using the thick film resist pattern 17 as an etching mask, the SiO$_2$ film 42b and the Si wafer 41 are subjected to RIE etching to form the second support beams 20 and additionally, the thick film resist pattern 17 is removed by ashing (FIG. 7H).

Figure 7I:
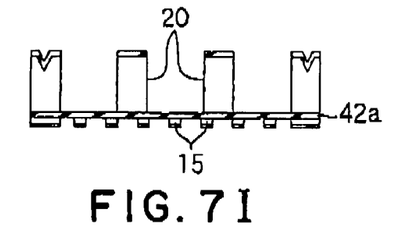
Figure 7J:
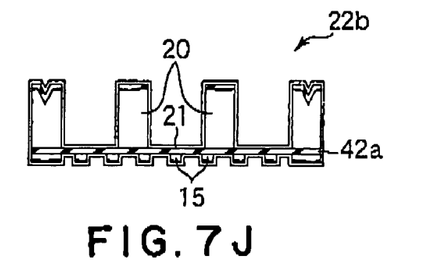

Thereafter, by ashing or cleaning, residual dross of the resist pattern 17 is removed and the adhesive 18 is eliminated after detaching the base wafer 19 (FIG. 7I). After that, by CVD (LP-CVD) under low pressure, the coating layer 21 of SiN for reinforcement is formed on the whole surface of the Si wafer 41, thereby completing a membrane member 22a which has the first support beams 15 and the second support beams 20 on both sides of the SiO$_2$ film 42a and whose whole surface is covered with the coating layer 21 of SiN (FIG. 7J).

Figure 8:
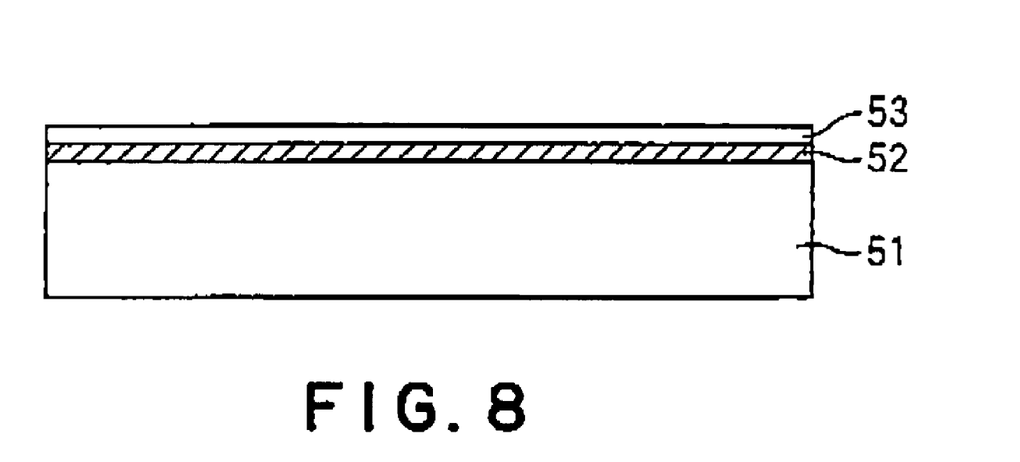
FIG. 8 is a sectional view showing a wafer used for the third manufacturing method of the invention.

The third manufacturing method of the invention will be described with reference to a Si wafer 51 of FIG. 8. In the third manufacturing method, the processes of FIGS. 7A to 7J are applicable to the Si wafer 51 having an Al film 52 (as the membrane) formed thereon and a poly-Si film 63 formed on the Al film 52 furthermore. Consequently, it becomes possible to form a membrane member which includes the first and second support beams on both sides of the Al film 52 and whose surface is covered, allover, with a coating layer of SiN.

Figure 9:
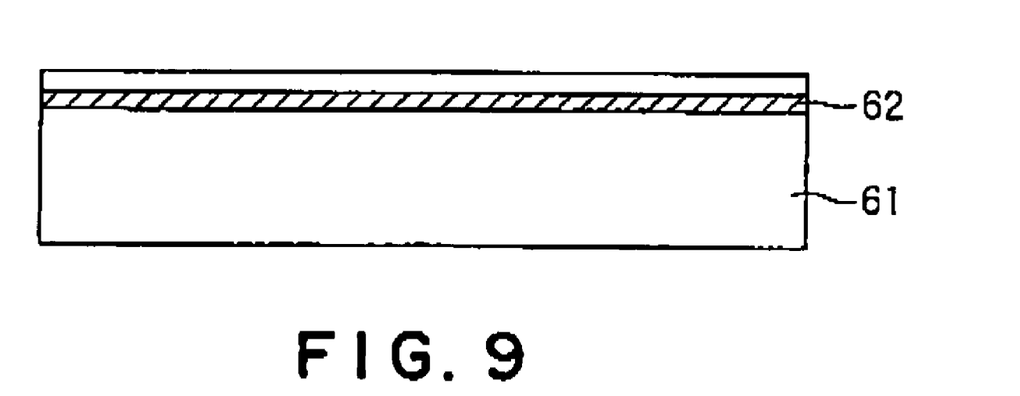
FIG. 9 is a sectional view showing a wafer used for the fourth manufacturing method of the invention.

The fourth manufacturing method of the invention will be described with reference to a Si wafer 61 of FIG. 9. In the fourth manufacturing method, the processes of FIGS. 3A to 3I are applicable to the Si wafer 61 containing an Al film 62 in parallel with a main surface forming the membrane. Consequently, it becomes possible to form a membrane member which includes the first and second support beams on both sides of the Al film 62 and whose surface is covered, allover, with a coating layer of SiN.

Figure 10A:
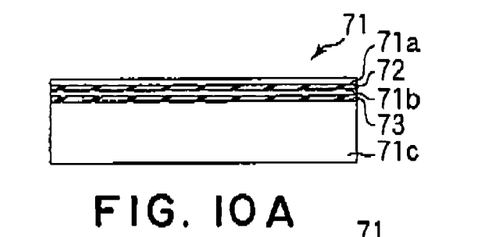
FIGS. 10A to 10I are sectional views explaining the flow of the fifth manufacturing method of the present invention, in due order.

Next, we describe the fifth manufacturing method of the invention. FIGS. 10A to 10I are sectional views showing the flow of the fifth manufacturing method. First, prepare a Si wafer (multilayered SOI wafer) 71 including two approximate SiO$_2$ films 72, 73 in parallel with a main surface of the wafer 71 (FIG. 10A). The SiO$_2$ film 72 is arranged in a position apart from the surface of the Si wafer 71 by approx. 2 μm, for example. While, the SiO$_2$ film 73 is apart from the SiO$_2$ film 72 at an interval from 0.4 μm to 2 μm. By these SiO$_2$ films 72, 73, a Si part of the Si wafer 71 is divided into an outer portion 71a outside the SiO$_2$ film 72, an intermediate portion 71b between the SiO$_2$ films 72, 73 and an outer portion 71c outside the SiO$_2$ film 73.

Figure 10B:
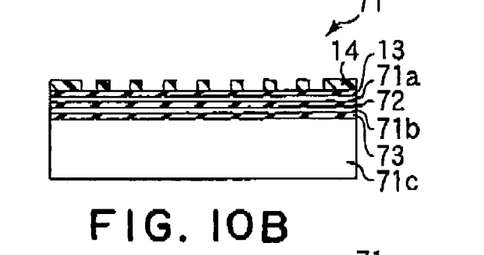
Figure 10C:
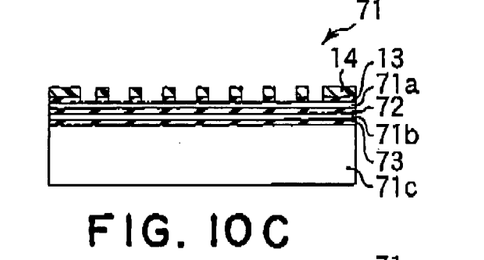

Next, the SiO$_2$ film 13 is formed on the main surface of the Si wafer 71 by e.g. TEOS and further, the resist pattern 14 is formed by photolithography (FIG. 10B). In succession, the SiO$_2$ film 13 is subjected to RIE-etching while utilizing the resist pattern 14 as a mask (FIG. 10C). By these processes of FIGS. 10B and 10C, a mask to etch the portion 71a of the Si wafer 71 is produced.

Figure 10D:
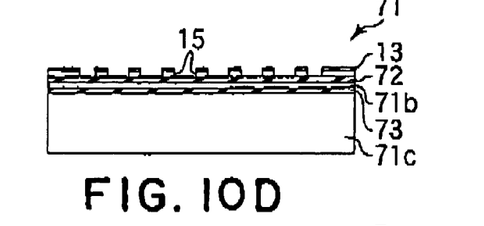

In succession, while using the resist pattern 14 and the patterned SiO$_2$ film 13 as an etching mask, the portion 71a of the Si wafer 71 is subjected to RIE etching, thereby forming first support beams 15 with a designated pattern and additionally, the resist pattern 14 is removed by ashing (FIG. 10D).

Figure 10E:
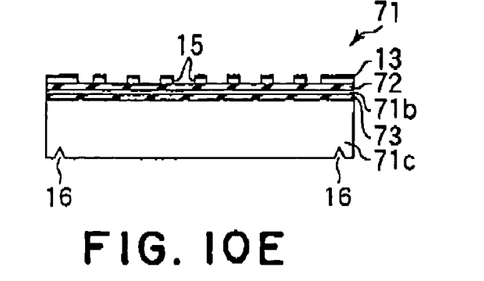

Next, in order to form the second support beams in the portion 71c of the Si wafer 71, the alignment marks 16 are formed on the Si wafer's surface on the side of the portion 71c on the basis of the pattern of the first support beams 15 by means of the above-mentioned laser processing (FIG. 10E).

Figure 10F:
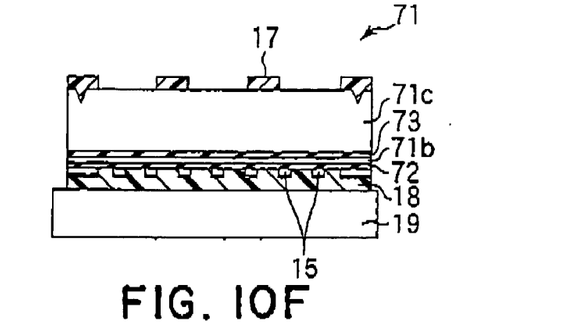

After that, the Si wafer 71 is reversed and further, the wafer's surface on the side of the first support beams 15 is applied on the base wafer 19 through the adhesive 18 etc. in order to protect the first support beams 15. Additionally, on the basis of the alignment marks 16, the thick film resist pattern 17 is formed on the surface of the portion 71c of the Si wafer 71 by photolithography (FIG. 10F). Note, the adhesive 18 may be replaced by a protective tape.

Figure 10G:
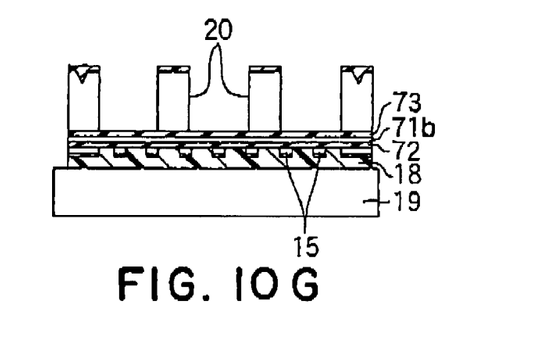

In secession, while using the thick film resist pattern 17 as an etching mask, the portion 71c of the Si wafer 71 is subjected to RIE etching to form the second support beams 20 and additionally, the thick film resist pattern 17 is removed by ashing (FIG. 10G).

Figure 10H:
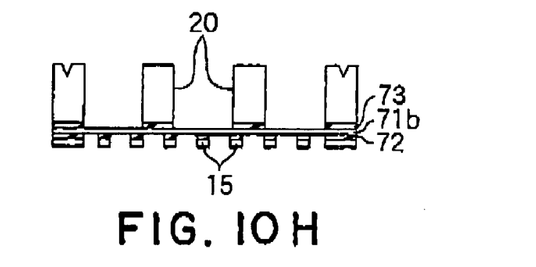

Thereafter, by ashing or cleaning, residual dross of the resist pattern 17 is removed. After detaching the base wafer 19, the adhesive 18 is eliminated and additionally, the SiO$_2$ films 72, 73 are etched in wet (FIG. 10H). Note, when the thickness of the portion 71b of the Si wafer 71 is too large, the SiO$_2$ film 73 is subjected to RIE etching after the process of FIG. 10G. Subsequently, the portion 71b is subjected to RIE etching, thereby accomplishing a desired thickness.

Figure 10I:
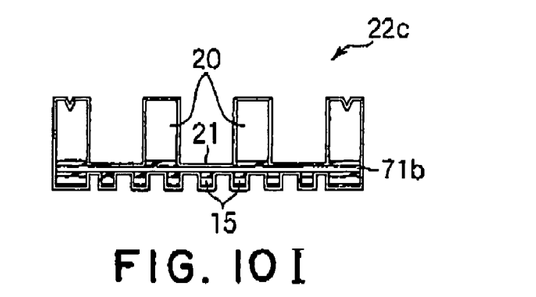

After that, by CVD (LP-CVD) under low pressure, the coating layer 21 of SiN for reinforcement is formed on the whole surface of the Si wafer 71, thereby completing a membrane member 22c which has the first support beams 15 and the second support beams 20 on both sides of the portion 71b of the Si wafer 71 and whose whole surface is covered with the coating layer 21 of SiN (FIG. 10I).

Figure 11:
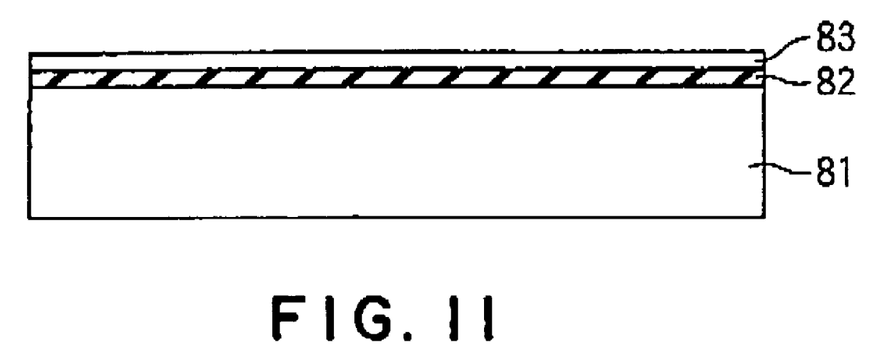
FIG. 11 is a sectional view showing a wafer used for the sixth manufacturing method of the invention.

The sixth manufacturing method of the invention will be described with reference to a Si wafer 81 of FIG. 11. In the sixth manufacturing method, the processes of FIGS. 7A to 7J are applicable to the Si wafer 81 having a sapphire (monocrystal Al$_2$O$_3$) film 82 (as the membrane) formed thereon and a poly-Si film 83 formed on the sapphire film 82. Consequently, it becomes possible to form a membrane member which includes the first and second support beams of Si on both sides of the sapphire film 82 and whose surface is covered, allover, with a coating layer of SiN. The advantage of adopting the sapphire film is that its thermal characteristic is similar to that of Si (silicon). Further, it is possible to enhance the cooling effect in comparison with the case of adopting compound $SiO_2$ as a membrane material, whose cooling effect is inferior to that of an element Si. It is noted, however, if the sapphire film has its cleavage surface perpendicular to the main surface, then it is feared that the membrane breaks off easily to exhibit an insufficient strength. Therefore, it is necessary to pay attention to an occurrence of such a situation. Preferably, the sapphire film 82 is formed so that its cleavage surface is substantially parallel with the main surface.

Figure 12:
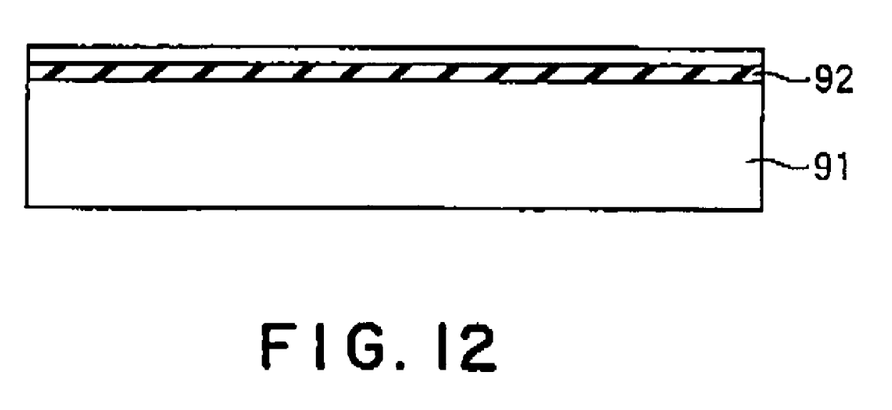
FIG. 12 is a sectional view showing a wafer used for the seventh manufacturing method of the invention.

The seventh manufacturing method of the invention will be described with reference to a Si wafer 91 of FIG. 12. In the seventh manufacturing method, the processes of FIGS. 3A to 3I are applicable to the Si wafer 91 containing a sapphire film 92 in parallel with the main surface (as the membrane) of the Si wafer 91. Consequently, it becomes possible to form a membrane member which includes the first and second support beams of Si on both sides of the sapphire film 92 and whose surface is covered, allover, with a coating layer of SiN. Also in this case, the similar advantages to those of the sixth manufacturing method can be obtained. As well, it is necessary to pay attention to the direction of a cleavage surface of the sapphire film. Therefore, it is preferable to select a Si wafer 91 where the cleavage surface of the sapphire film 92 is substantially parallel with the main surface.

In the above way, since the membrane member having the first and second support beams on both sides of the membrane is produced by dry-etching in accordance with the first to the seventh methods, it is possible to provide the membrane member with high strength and high heat-radiation due to both of the first and second support beams while keeping an effective area of the membrane broad.

Note, the present invention may be modified without being limited to only the above-mentioned embodiments. For instance, although the membrane is formed by a Si wafer in common with the above embodiments, the invention is not limited to this material only. Although $SiO_2$, Al, Si and sapphire (monocrystal $Al_2O_3$) are adopted as the membrane material, the invention is not limited to these elements only. Further, although the arrangement where the coating layer is formed on the whole surface of the membrane member is illustrated as one example of reinforcing the membrane member, without being limited to this arrangement, for example, the whole surface of the membrane member may be covered with e.g. SiC film, SiP film or the like. Alternatively, the reinforcement may be attached by doping phosphorous (P) into the membrane. In the above embodiments, the first support beams and the second support beams are respectively patterned in a lattice manner. Without being limited to this pattern, a variety of patterns may be adopted for any purpose. Still further, although the above embodiments exhibit, as one example of positioning, one method of first detecting the pattern of the first support beams and next forming the alignment marks on the surface forming the second support beams on the basis of the above information of pattern, any method will do without being limited to this method so long as the positioning of the second support beams can be accomplished on the basis of the pattern of the first support beams. Further, although the above embodiments exhibit one example where the positioning to form the second support beams is carried out on the basis of the positions of the first support beams directly, the invention is not limited to this example only. For instance, if the positions of the first support beams are determined on the basis of the outer circumference of a wafer, notches or an orientation flat, the positioning to form the second support beams may be carried out by the outer circumference of the wafer, the notches or the orientation flat, directly. Even in this method, it is possible to accomplish the positioning of the first support beams and the second support beams. As a result, it is possible to make an effective area of opening parts of the membrane member broad. Moreover, the positioning of the first support beams and the second support beams may be carried out by using a not-shown "both-sides" aligner or a not-shown "back-side" aligner.

Finally, it will be understood by those skilled in the art that the foregoing descriptions are nothing but embodiments of the disclosed manufacturing method for a membrane member and therefore, various changes and modifications may be made within the scope of claims.

The invention claimed is:

1. A method of manufacturing an electron beam transmission window of an electron beam irradiation tube having a base membrane having opposed first and second surfaces, first support beams provided on the first surface of the base membrane, and second support beams provided on the second surface of the base membrane, said method comprising the steps of:

providing a substrate including:
a base membrane forming layer having a first side and a second side;
a first layer provided on the first side of the base membrane forming layer; and
a second layer provided on the second side of the base membrane forming layer;

partially etching the first layer in dry to form the first support beams on the first side of the base membrane forming layer, and to partially expose the first side of the base membrane forming layer between the first support beams, and partially etching the second layer in dry to form the second support beams on the second side of the base membrane forming layer and to partially expose the second side of the base membrane forming layer between the second support beams, thereby forming a structure including the base membrane provided by the base membrane forming layer and having the first and second surfaces provided by the first and second sides of the base membrane forming layer, respectively, the first support beams formed of parts of the first layer and provided on the first surface of the base membrane and the second support beams formed of parts of the second layer provided on the second surface of the base membrane; and forming a coating layer of SiN on the structure such that the coating layer covers whole surfaces of all of the first and the second support beams, and also covers whole areas of the first surface of the base membrane exposed between the first support beams, and also covers whole areas of the second surface of the base membrane between the second support beams.

2. The method according to claim 1, further comprising the steps of:

forming a first mask having a first pattern on a surface of the first layer of the substrate; and forming a second mask having a second pattern on a surface of the second layer of the substrate, wherein the step of etching the first layer of the substrate is performed by using the first mask as an etch mask, and the step of etching the second layer of the substrate is performed by using the second mask as an etch mask.

3. The method according to claim 2, further comprising a step of positioning the surface of the second layer of the substrate utilizing a positioning reference on the substrate between the step of etching the first layer and the step of forming the second mask, wherein the second mask having the second pattern is formed on the surface of the second layer of the substrate thus positioned.

4. The method according to claim 3, wherein the first pattern is utilized as the positioning reference.

5. The method according to claim 3, wherein an outer circumference is utilized as the positioning reference, and the outer circumference is also utilized as a positioning reference for positioning the surface of the first layer before the step of forming the first mask.

6. The method according to claim 5, wherein a notch formed on the outer circumference is utilized as the positioning reference.

7. The method according to claim 5, wherein an orientation flat formed on the outer circumference is utilized as the positioning reference.

8. The method according to claim 3, wherein the positioning step includes the steps of detecting the positioning reference, giving feedback of positional information of the positioning reference and forming a positioning mark on the surface of the second layer of the substrate on the basis of the positional information.

9. The method according to claim 1, wherein the base membrane forming layer includes an $SiO_2$ film, the first layer includes a silicon film, and the second layer includes a silicon film.

10. The method according to claim 1, wherein the base membrane forming layer includes an $SiO_2$ film, the first layer includes a polycrystalline silicon film, and the second layer includes a silicon film.

11. The method according to claim 1, wherein the base membrane forming layer includes an aluminum film, the first layer includes a silicon film, and the second layer includes a silicon film.

12. The method according to claim 1, wherein the base membrane forming layer includes an aluminum film, the first layer includes a polycrystalline silicon film, and the second layer includes a silicon film.

13. The method according to claim 1, wherein the base membrane forming layer includes a sapphire film, the first layer includes a silicon layer, and the second layer includes a silicon layer.

14. The method according to claim 1, wherein the base membrane forming layer includes a sapphire film, the first layer includes a polycrystalline silicon film, and the second layer includes a silicon film.

15. The method according to claim 13, wherein the base membrane forming layer comprises a sapphire film which has a cleavage surface is substantially parallel with a main surface of the substrate.

16. The method according to claim 1, wherein the coating layer is formed by heat treatment.

17. The method according to claim 1, further comprising a step of adjusting heights of the first support beams or the second support beams by uniformly etching the first layer or the second layer, after selectively etching the first layer or the second layer by using the first mask or the second mask.

18. The method according to claim 1, wherein the first support beams or the second support beams are formed in a lattice pattern.

19. The method according to claim 18, wherein ones of the first support beams and the second support beams are larger in height than and also larger in grid interval than the others of the first support beams and the second support beams.

20. A method of manufacturing an electron beam transmission window of an electron beam irradiation tube having a base membrane having opposed first and second surfaces, first support beams provided on the first surface of the base membrane, and second support beams provided on the second surface of the base membrane, said method comprising the steps of:

providing a substrate including a first layer, a second layer, a third layer, a fourth layer and a fifth layer which are stacked in that order;

partially etching the first and second layers in dry to form the first support beams on a first side of the third layer, and to partially expose the first side of the third layer between the first support beams, and partially etching the fourth and fifth layers in dry to form the second support beams on a second side of the third layer and to partially expose the second side of the third layer between the second support beams, thereby forming a structure including the base membrane provided by the third layer and having the first and second surfaces provided by the first and second sides of the third layer, respectively, the first support beams formed of parts of the first and second layers and provided on the first surface of the base membrane and the second support beams formed of parts of the fourth and fifth layers provided on the second surface of the base membrane; and forming a coating layer of SiN on the structure such that the coating layer covers whole surfaces of all of the first and the second support beams, and also covers whole areas of the first surface of the base membrane exposed between the first support beams, and also covers whole areas of the second surface of the base membrane between the second support beams.

21. The method according to claim 20, further comprising the steps of:

forming a first mask having the first pattern on a surface of the first layer of the substrate; and forming a second mask having the second pattern a surface of the fifth layer of the substrate, wherein the step of etching the first and second layers of the substrate is performed by using the first mask as an etch mask, and the step of etching the fourth and fifth layers of the substrate is performed by using the second mask as an etch mask.

22. The method according to claim 20, wherein the second layer comprises an $SiO_2$ film, the third layer comprises a silicon film and the fourth layer comprises an $SiO_2$ film.

23. The method according to claim 20, wherein the second layer comprises an aluminum film, the third layer comprises a silicon film and the fourth layer comprises an aluminum film.

24. The method according to claim 20, wherein the second layer comprises a sapphire film, the third layer comprises a silicon film and the fourth layer comprises a sapphire film.

25. The method according to claim 24, wherein each of the sapphire films has a cleavage surface is substantially parallel with a main surface of the substrate.

26. The method according to claim 20, wherein the coating layer is formed by heat treatment.

27. The method according to claim 1, wherein the coating layer is formed such that the structure is entirely embraced by the coating layer and that there is no part of the structure which is not covered with the coating layer.

28. The method according to claim 20, wherein the coating layer is formed such that the structure is entirely embraced by the coating layer and that there is no part of the structure which is not covered with the coating layer.

29. A method of manufacturing an electron beam transmission window of an electron beam irradiation tube comprising the steps of:

etching a first surface of a substrate in dry thereby forming first support beams patterned with a first pattern on the first surface of the substrate, and     etching a second surface of the substrate in dry thereby forming second support beams patterned with a second pattern on the second surface of the substrate,     whereby the membrane member having the first and second support beams formed on both surfaces of a membrane is manufactured; and     thereafter forming a coating layer of SiN covering whole surfaces of the membrane member,     wherein the substrate is a silicon substrate provided therein with: two $SiO_2$ membranes formed in parallel with a main surface of the substrate; a first silicon layer located between the two $SiO_2$ membranes; and second and third silicon layers located outside the two $SiO_2$ membranes, respectively;

wherein the step of forming the first support beams and the step of forming the second support beams are performed by etching the second and third layers and further etching the two $SiO_2$ membranes such that the membrane member is manufactured to have the support beams on both surfaces of the first silicon membrane.

* * * * *